(12) United States Patent
Shklover

(10) Patent No.: US 9,703,209 B2
(45) Date of Patent: Jul. 11, 2017

(54) REFLECTIVE OPTICAL ELEMENT FOR GRAZING INCIDENCE IN THE EUV WAVELENGTH RANGE

(71) Applicant: Carl Zeiss Laser Optics GmbH, Oberkochen (DE)

(72) Inventor: Vitaliy Shklover, Konigsbronn (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 133 days.

(21) Appl. No.: 14/321,149

(22) Filed: Jul. 1, 2014

(65) Prior Publication Data

US 2015/0009480 A1 Jan. 8, 2015

(30) Foreign Application Priority Data

Jul. 8, 2013 (DE) .................. 10 2013 107 192

(51) Int. Cl.
*G03B 27/54* (2006.01)
*G03F 7/20* (2006.01)
*G02B 5/08* (2006.01)

(52) U.S. Cl.
CPC ....... *G03F 7/70316* (2013.01); *G02B 5/0808* (2013.01); *G02B 5/0891* (2013.01); *G03F 7/70958* (2013.01)

(58) Field of Classification Search
CPC ............. G03F 7/70316; G03F 7/70958; G02B 5/0808; G02B 5/0891
See application file for complete search history.

(56) References Cited

U.S. PATENT DOCUMENTS

| 5,310,603 | A | * | 5/1994 | Fukuda | B32B 15/08 359/584 |
| 5,384,817 | A | * | 1/1995 | Crowther | B82Y 10/00 378/145 |
| 5,433,988 | A | * | 7/1995 | Fukuda | B32B 15/08 359/359 |
| 5,939,201 | A | * | 8/1999 | Boire | C03C 17/002 359/839 |
| 6,013,399 | A | * | 1/2000 | Nguyen | B82Y 10/00 430/5 |
| 6,522,716 | B1 | * | 2/2003 | Murakami | B82Y 10/00 378/34 |
| 7,193,228 | B2 | | 3/2007 | Bowering et al. | |
| 7,217,940 | B2 | | 5/2007 | Partlo et al. | |
| 7,309,871 | B2 | | 12/2007 | Bowering | |

(Continued)

FOREIGN PATENT DOCUMENTS

DE 10 2006 006 283 8/2007
EP 1 882 984 A1 1/2008
(Continued)

OTHER PUBLICATIONS

B.L. Henke et al., "X-ray interactions: photoabsorption, scattering, transmission, and reflection at E=50-30000 eV, Z=1-92," Atomic Data and Nuclear Data Tables, vol. 54 (No. 2), 181-342 (Jul. 1993).

(Continued)

*Primary Examiner* — Deoram Persaud
(74) *Attorney, Agent, or Firm* — Fish & Richardson P.C.

(57) ABSTRACT

An optical element comprises a reflecting coating on a substrate. The reflecting coating contains boron and can have a thickness of more than 50 nm.

30 Claims, 6 Drawing Sheets

(56) References Cited

U.S. PATENT DOCUMENTS

| | | | |
|---|---|---|---|
| 8,605,255 B2 | 12/2013 | Mann et al. | |
| 2002/0048341 A1* | 4/2002 | Itoga | G03F 7/70008 378/34 |
| 2002/0136352 A1* | 9/2002 | Protopopov | G03H 5/00 378/36 |
| 2005/0118835 A1* | 6/2005 | Kurt | G03F 7/70958 438/778 |
| 2005/0279951 A1* | 12/2005 | Bakker | G03F 7/70958 250/492.1 |
| 2007/0160916 A1* | 7/2007 | Ikuta | B82Y 10/00 430/5 |
| 2008/0088916 A1* | 4/2008 | Benoit | B82Y 10/00 359/359 |
| 2009/0009858 A1 | 1/2009 | Feigl et al. | |
| 2009/0109537 A1* | 4/2009 | Bright | G02B 5/287 359/588 |
| 2010/0027273 A1* | 2/2010 | Deacon | G02B 5/0808 362/341 |
| 2010/0028572 A1* | 2/2010 | Kobayashi | C03C 15/00 428/34.1 |
| 2010/0033702 A1 | 2/2010 | Rigato | |
| 2010/0265481 A1 | 10/2010 | Mann et al. | |
| 2011/0228243 A1 | 9/2011 | Banine et al. | |
| 2012/0134015 A1* | 5/2012 | Paul | B82Y 10/00 359/359 |
| 2012/0250144 A1* | 10/2012 | Ehm | B82Y 10/00 359/360 |
| 2013/0194687 A1* | 8/2013 | Hall | G02B 1/04 359/884 |
| 2014/0022525 A1* | 1/2014 | Enkisch | G02B 17/0663 355/67 |
| 2014/0132941 A1 | 5/2014 | Mann et al. | |

FOREIGN PATENT DOCUMENTS

| | | |
|---|---|---|
| EP | 2083328 A1 | 7/2009 |
| WO | WO 2006/050891 A2 | 5/2006 |
| WO | WO 2012/171674 A1 | 12/2012 |

OTHER PUBLICATIONS

German Office Action, with translation thereof, for corresponding DE Appl No. 10 2013 107 192.9, dated Jan. 24, 2014.

* cited by examiner

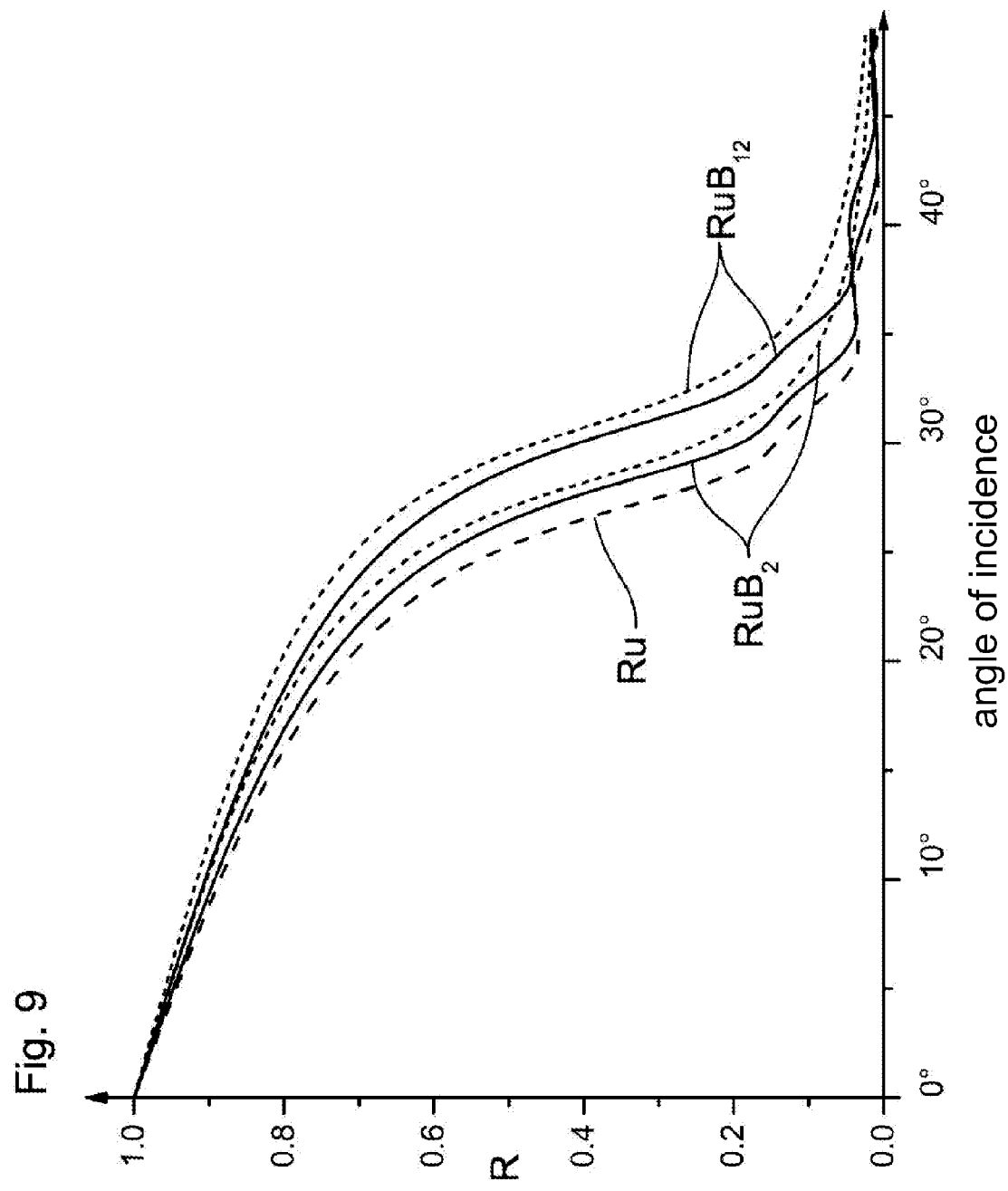

REFLECTIVE OPTICAL ELEMENT FOR GRAZING INCIDENCE IN THE EUV WAVELENGTH RANGE

CROSS-REFERENCE TO RELATED APPLICATION

This application claims priority under 35 U.S.C. §119 to German patent application DE 10 2013 107 192.9, filed on Jul. 8, 2013, the entire contents of which are incorporated by reference herein.

FIELD

The present disclosure relates to a reflective optical element for grazing incidence in the extreme ultraviolet wavelength range, comprising a reflecting coating on a substrate. Furthermore, the disclosure relates to an optical system for EUV lithography and to an EUV lithography device comprising such a reflective optical element.

BACKGROUND

In EUV lithography devices, reflective optical elements for the extreme ultraviolet (EUV) wavelength range (e.g. wavelengths between approximately 5 nm and 20 nm), such as photo masks or mirrors on the basis of multi-layer systems, are used for the lithography of semiconductor components. Since EUV lithography devices generally comprise a plurality of reflective optical elements, it is desirable that the latter have a reflectivity which is high to ensure a sufficiently high overall reflectivity.

Plasma sources, among others, can serve as radiation sources. The plasma can be generated by discharge (DPP source) or, preferably, by laser excitation (LPP source). To this end, material droplets are exposed to intensive laser radiation in order to excite them to form a plasma which, among other things, emits radiation in the EUV wavelength range. In order to enhance the portion of EUV radiation available for EUV lithography, use is made, among other things, of mirrors for grazing incidence. These generally are substrates with a reflecting coating made of metal. By way of example, such mirrors are described in EP 1 882 984 A1. There, for example, reflecting coatings made of molybdenum, ruthenium, rhodium, palladium, niobium or zirconium are described, which achieve reflectivities of more than 60% for angles of incidence of up to 15°, in part up to 20°, in relation to the mirror surface.

SUMMARY

The present disclosure provides reflective optical elements for the grazing incidence in the extreme ultraviolet wavelength range, with a high reflectivity.

A reflective optical element for grazing incidence in the extreme ultraviolet wavelength range is disclosed which comprises a reflecting coating on a substrate, wherein the reflecting coating has a thickness of more than 50 nm and contains boron.

It was found that reflecting coatings having a thickness of 50 nm or more and containing boron have a higher reflectivity in the case of grazing incidence of EUV radiation. Particularly if a comparison is made between known reflective optical elements of this type, having a reflective coating of a specific composition, and corresponding reflective optical elements with a reflective coating having this composition with an additional boron content, it is possible to obtain the same reflectivities at higher angles of incidence, leading to a higher overall reflectivity of the respective reflective optical element.

In preferred embodiments, the reflecting coating has the boron at least in part in form of a boride of any stoichiometry in order to achieve an increase in the overall reflectivity. By way of example, a boride of a substance A could be described by $A_xB_y$, where x, y are numbers between 0 and 1 and $x+y=1$. Advantageously, the reflecting coating in this case has the boron at least in part in form of a metal boride of any stoichiometry or of a mixed boride, in particular of a binary or ternary metal boride of any stoichiometry, i.e. a boride compound of two or three metals, for example $M1_{x1}M2_{x2}B_y$ or $M1_{x1}M2_2M3_{x3}B_y$. Here, M1, M2, M3 are different metals and x1, x2, x3, y are numbers between 0 and 1, and $x1+x2+y=1$ and $x1+x2+x3+y=1$, respectively. Compared to conventional elements with a reflective optical coating not containing boride, the reflective optical elements mentioned here can exhibit the same reflectivities at angles of incidence that are 2° to 3° higher, as a result of which the reflectivity, which is already high in the case of, in particular, metallic reflective coatings, can be increased by several percent at a specific angle of incidence.

Preferably, the reflecting coating has the boron at least in part in form of a boride of any stoichiometry of one or more of the metals of the group containing molybdenum, ruthenium, niobium, zirconium, rhodium, rhenium, palladium, gold, platinum, nickel, tantalum, tungsten, osmium, iridium, titanium, hafnium, magnesium, calcium and strontium. Compared to the metal coating, not containing a boride, of a corresponding reflective optical element, by using one of these borides, it is possible to achieve the same reflectivity at an angle of incidence which is higher by a few degrees, in particular in the case of angles of incidence of greater than 15° or more.

In preferred embodiments, the reflecting coating has the boron at least in part in form of a boride of a stoichiometry which varies over the thickness of the reflecting coating. This allows material properties of the coating other than the reflectivity to be adapted to corresponding properties of the substrate, in particular by virtue of providing a different boron concentration near the substrate than on the side of the reflecting coating facing away from the substrate. By way of example, such properties can be adhesion properties, expansion coefficients, tension properties, etc.

Advantageously, the substrate is made of metal, a metal alloy, glass, glass ceramics, ceramics, a monocrystalline or polycrystalline semiconductor or a composite material. Depending on the desired properties of the reflective optical element, e.g., the workability, the possibility of obtaining extended substrates or else an expansion coefficient, which is small may be prioritized when selecting the substrate material.

Advantageously, an adhesion promoter layer is disposed between the substrate and the reflecting coating in order to improve the adhesion between substrate and reflecting coating. Preferably, the reflecting coating has the boron at least in part in form of a metal boride or a mixed metal boride of any stoichiometry, and an adhesion promoter layer, which has the metal of the metal boride or one of the metals of the mixed metal boride, is disposed between the substrate and the reflective coating. In conventional coating processes, the application of the metal layer as an adhesion promoter layer can be combined without much outlay with the application of the boride layer as reflecting coating.

In preferred embodiments, the reflecting coating has a thickness of 100 nm or more, preferably of 1000 nm or more. It was found that the reflectivity increases with increasing thickness of the reflective coating containing boron; in particular, it was also found that the same reflectivity can be achieved at slightly higher angles of incidence as in the case of smaller angles of incidence in the case of thinner coatings.

In particularly preferred embodiments the reflecting coating consists of one boron-containing layer. In particular for reflective optical elements for grazing incidence, single layer reflecting coatings can have a sufficient reflectivity. For grazing incidence, one does not need complex multilayer systems based on Bragg reflection as for reflective optical elements for normal incidence. The lower the number of layers, the less the time and effort for producing the reflecting coating can be.

In a particularly preferred embodiment, the reflective optical element is a collector mirror. In EUV lithography, collector mirrors are often used as a first mirror in the beam direction downstream of the radiation source, in particular of plasma radiation sources, in order to collect the radiation emitted by the radiation source in different directions and in order to reflect the radiation in a focused manner to the mirror following next.

Furthermore, the object is achieved by an optical system for EUV lithography or an EUV lithography device comprising such a reflective optical element.

BRIEF DESCRIPTION OF THE DRAWINGS

The present disclosure is intended to be explained in more detail with reference to preferred exemplary embodiments. In this respect:

FIG. 9 shows, as a function of angle of incidence, the reflectivity of a reflecting coating made of $RuB_2$ with a thickness of 100 nm and a thickness of 1000 nm, and made of $RuB_{12}$ with a thickness of 100 nm and a thickness of 1000 nm, compared to a reflecting coating made of ruthenium.

DETAILED DESCRIPTION

Figure 1:
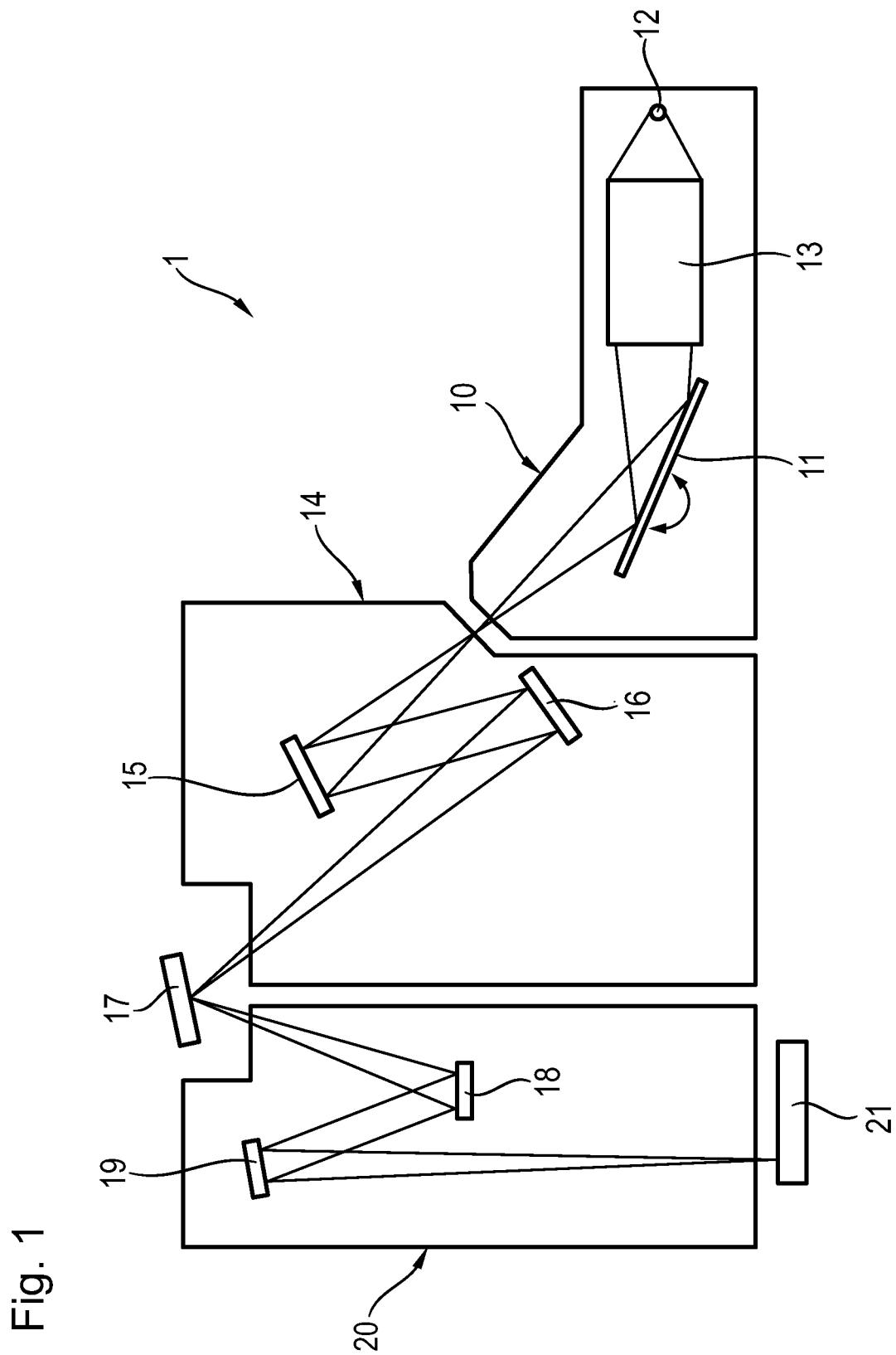
FIG. 1 schematically shows an embodiment of an EUV lithography device made of optical systems and comprising a reflective optical element as proposed here.

FIG. 1 schematically depicts an EUV lithography device 1, including a beam shaping system 10, an illumination system 14, a photomask 17 and a projection system 20. The EUV lithography device 1 is operated under vacuum conditions such that, in the interior thereof, as little of the EUV radiation as possible is absorbed.

By way of example, a plasma source, or else a synchrotron, can serve as a radiation source 12. In the example depicted here, this is a plasma source. The radiation emitted in the wavelength range from approximately 5 nm to 20 nm is initially focused by a collector mirror 13 and, in the example depicted here, subsequently spectrally filtered with the aid of a monochromator 11. The operating beam is then introduced into the illumination system 14. In the example depicted in FIG. 1, the illumination system 14 comprises two mirrors 15, 16. The mirrors 15, 16 guide the beam onto the photomask 17, which has the structure intended to be imaged onto a wafer 21. The photomask 17 is likewise a reflective optical element for the EUV wavelength range which element is interchanged depending on production process. With the aid of the projection system 20, the beam reflected from the photomask 17 is projected onto the wafer 21 and, as a result thereof, the structure of the photomask 17 is imaged thereon. In the example depicted here, the projection system 20 comprises two mirrors 18, 19. Reference is made to the fact that both the projection system 20 and the illumination system 14 can respectively comprise only one mirror, or else three, four, five or more mirrors. The beam shaping system 10 and the illumination system 14 can also be a common optical system. In particular, it is also possible to dispense with the monochromator 11 in some variants.

In the present example, only the collector mirror 13 is designed as a mirror for grazing incidence. In principle, reflective optical elements for grazing incidence could also be used at different points within the EUV lithography device 1. The collector mirror 13 depicted here is a reflective optical element for grazing incidence in the extreme ultraviolet wavelength range, comprising a reflecting coating of a thickness of at least 50 nm, which contains boron, on a substrate.

Figure 2:
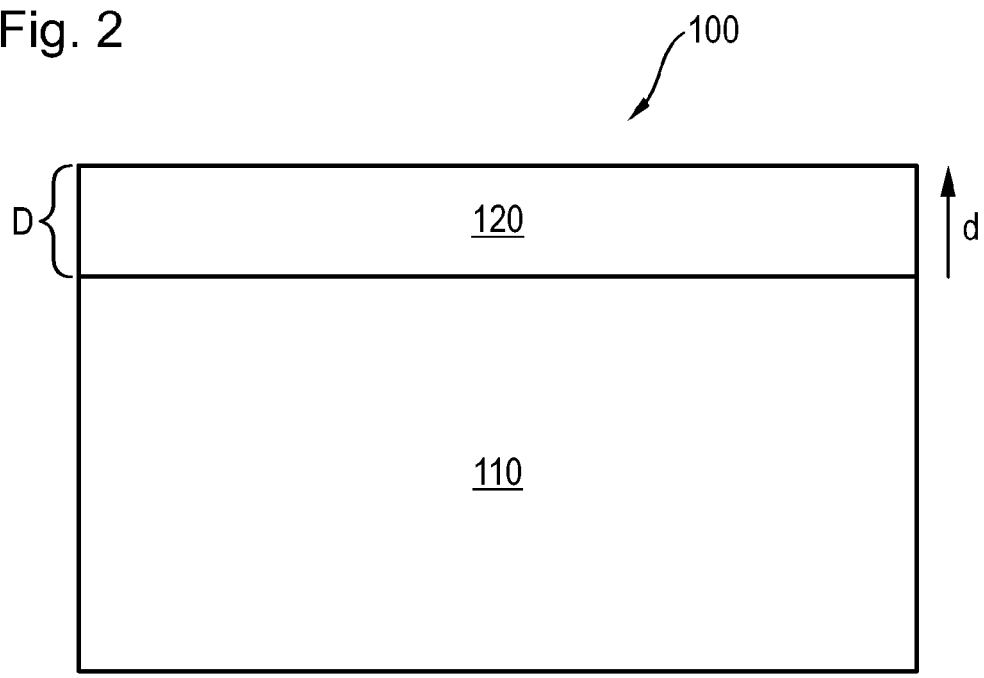
FIG. 2 schematically shows a first embodiment of a reflective optical element as proposed here.
Figure 3:
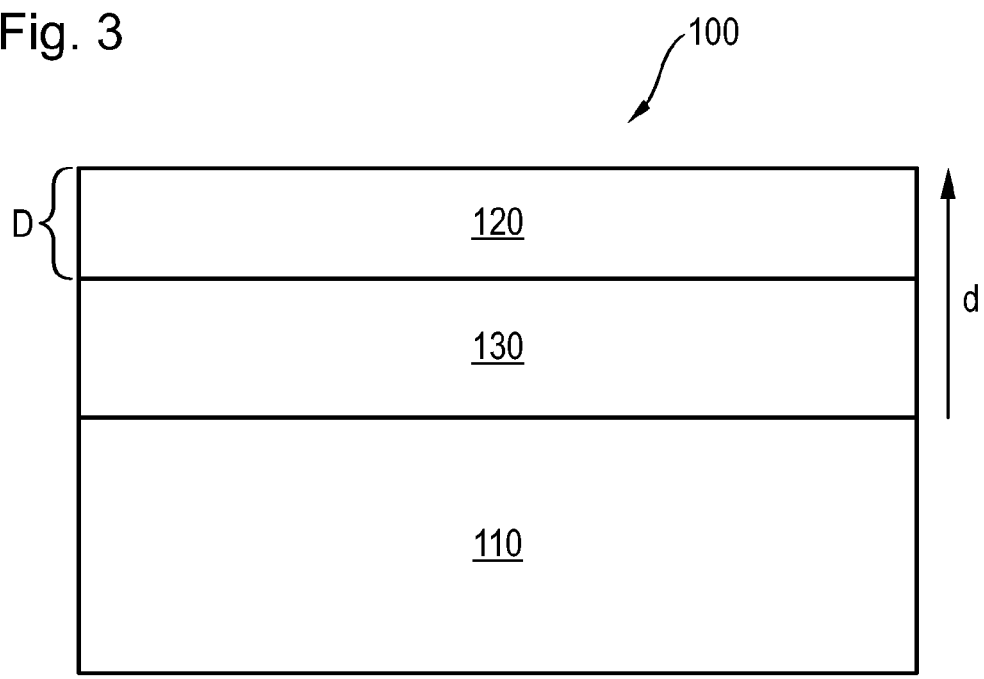
FIG. 3 schematically shows a second embodiment of a reflective optical element as proposed here.

The schematic design of two embodiments of a reflective optical element 100 for the grazing incidence, with a boron-containing reflecting coating 120, is depicted in FIGS. 2 and 3. In the example depicted in FIG. 2, a boron-containing coating 120 is disposed on a substrate 110 that, for example, can be made of metal, a metal alloy, glass, glass ceramics, ceramics, a monocrystalline or polycrystalline semiconductor or a composite material. In the example depicted in FIG. 3, an adhesion promoter layer 130 is disposed between the substrate 110 and the reflecting coating 120 in order to improve the adhesion of the reflecting coating 120 on the substrate 110. In these examples as illustrated, the boron containing reflecting coating of a thickness of at least 50 nm is designed as single layer 120. In other variants, the coating may be designed to consist of two, three or four layers. But preferably the number of layers is significantly lower than for multilayer systems as used for normal incidence.

The reflecting coating 120 in the exemplary embodiments considered in the following is a boride of any stoichiometry, in particular a metal boride or a mixed boride in form of a binary or ternary metal boride. Here, the reflecting coating in the exemplary embodiments considered here is an individual layer made of a boride of any stoichiometry of one or more of the metals of the group containing molybdenum, ruthenium, niobium, zirconium, rhodium, rhenium, palladium, gold, platinum, nickel, tantalum, tungsten, osmium, iridium, titanium, hafnium, magnesium, calcium and strontium. In further variants, the reflecting coating can also be designed as a system with various layers made of borides of different substances, in particular of different metals or metal combinations.

Figure 4:
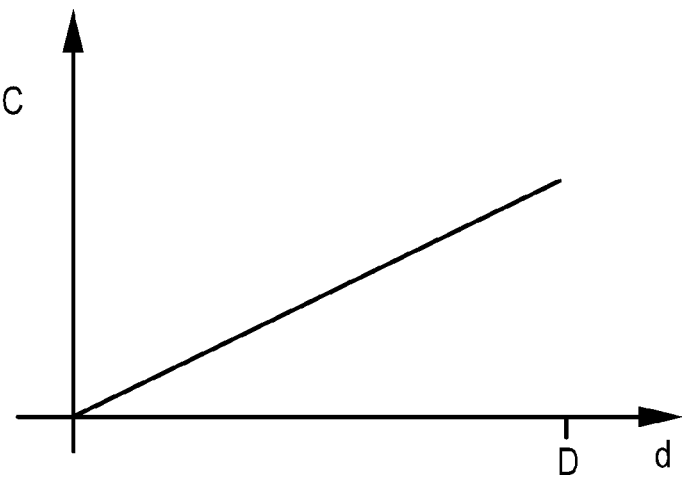
FIGS. 4 to 6 schematically show different distributions of the boron concentration over the thickness of the reflecting coating.
Figure 5:
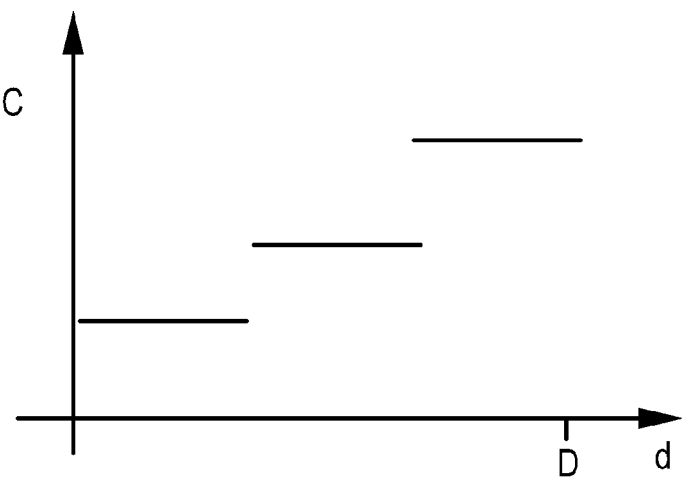
Figure 6:
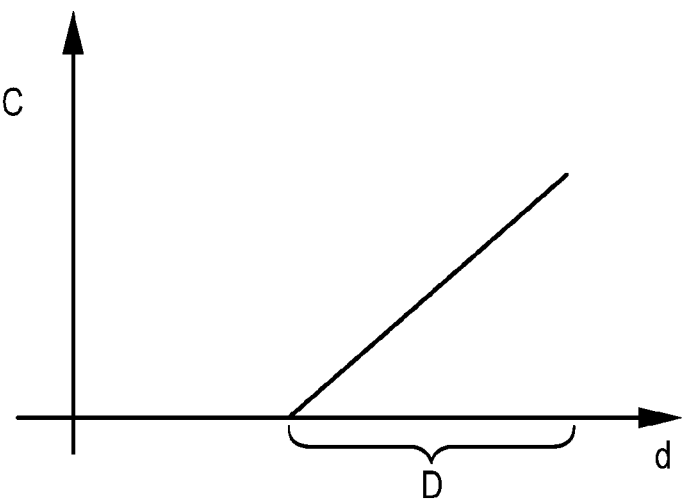

In some variants of the exemplary embodiments considered here in an exemplary manner, the reflecting coating 120 has the boron in form of a boride of a stoichiometry which varies over the thickness D of the reflecting coating 120. Various examples for the variation of the boron concentration C are depicted schematically in FIGS. 4 to 6. Here, the profile of the concentration C is considered as a function of the distance d from the substrate surface. In the examples, selected here in a purely exemplary manner, the concentration C increases with increasing distance d from the substrate. Here, the profile is continuous in the examples depicted in FIGS. 4 and 6, while it is discontinuous in the example depicted in FIG. 5 and the concentration C increases in constant steps. In the example depicted in FIG. 6, the boron concentration C is initially zero over the thickness of the adhesion promoter layer. In the example depicted here in FIG. 6, the reflecting coating is a metal boride or a mixed metal boride of any stoichiometry, and the adhesion promoter layer is the metal of the metal boride or, optionally, one of the metals of the mixed metal boride of the reflecting coating.

The reflective optical elements proposed here are produced substantially in a conventional manner. In a first step, a form, also referred to as mandrel, made of metal, metal alloy, glass, glass ceramics, ceramics, monocrystalline or polycrystalline semiconductor or composite material, is produced and polished to the desired surface roughness using known methods. Too high a surface roughness would lead to a reduction in the reflectivity. Optionally, a separation layer made of metal, metal alloy, glass, semiconductor or plastic, e.g. Parylene, can be deposited on the form. The reflecting coating containing boron is deposited thereover, for example via physical vapor deposition, in particular sputtering, e.g., magnetron sputtering or reactive sputtering, or chemical vapor deposition or atomic layer deposition, in particular plasma-enhanced, particle beam-enhanced, photo-enhanced or else as metal organic vapor deposition. Optionally, a further layer can be deposited thereon as adhesion promoter layer. Subsequently, a substrate is applied for mechanical strengthening. By way of example, this can be brought about by electroplating, vapor deposition or atomic layer deposition, plasma spraying, laser sintering, microwave sintering or else local material buildup in the style of three-dimensional printing. In the process, it is also possible e.g. to install cooling channels. These are advantageous, in particular in the subsequent use as collector mirror, because the latter is exposed to a very high thermal load due to the vicinity thereof to the radiation source. In a final step, the mirror is separated from the mandrel by pulling apart. A possible separation layer can remain adhering to the mandrel or the reflecting coating. In the latter case, it can be removed by plasma-enhanced, photo-enhanced or particle-enhanced or else wet chemical methods.

Figure 7:
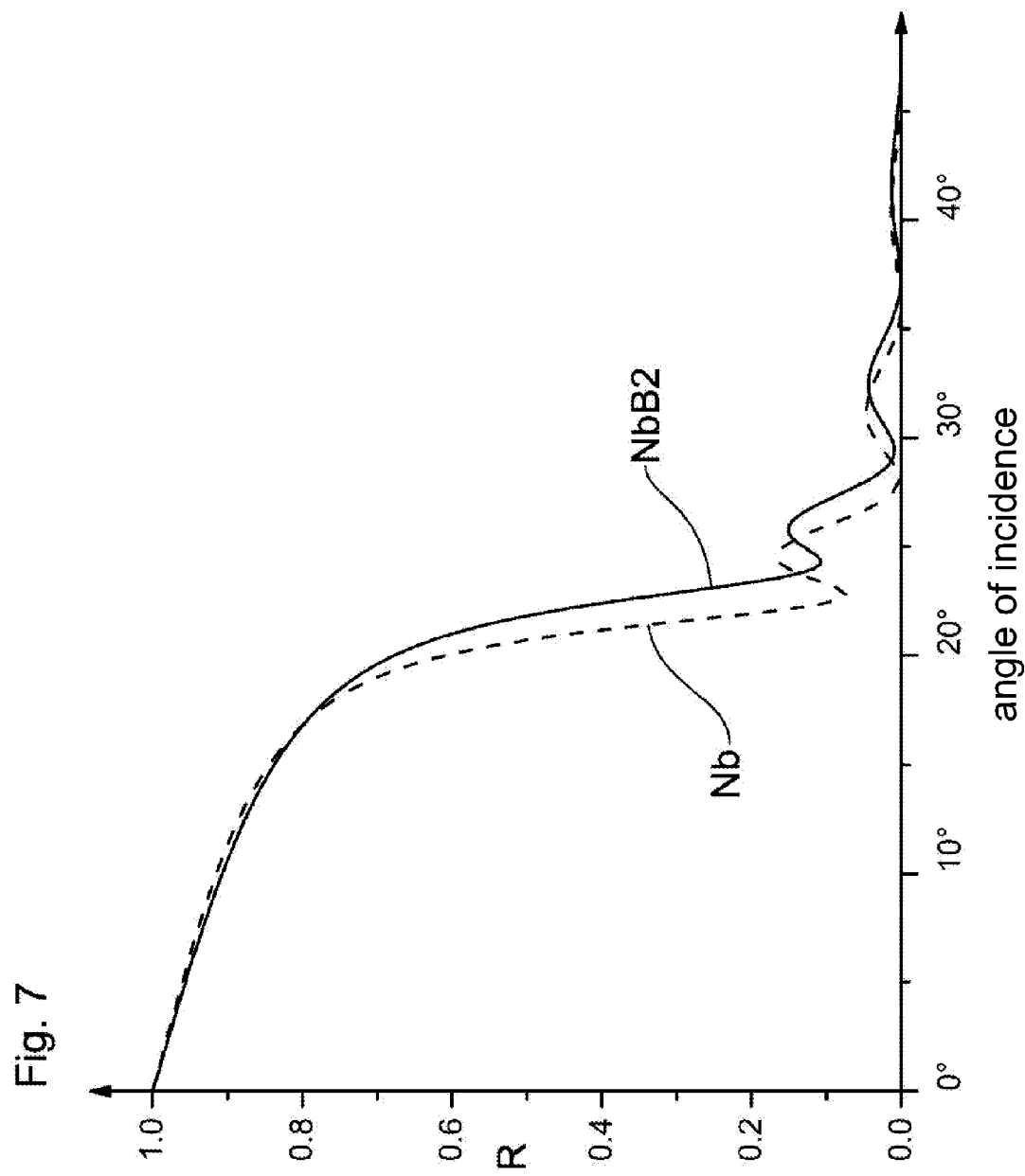
FIG. 7 shows, as a function of angle of incidence, the reflectivity of a reflecting coating made of niobium boride compared to a reflecting coating made of niobium.
Figure 8:
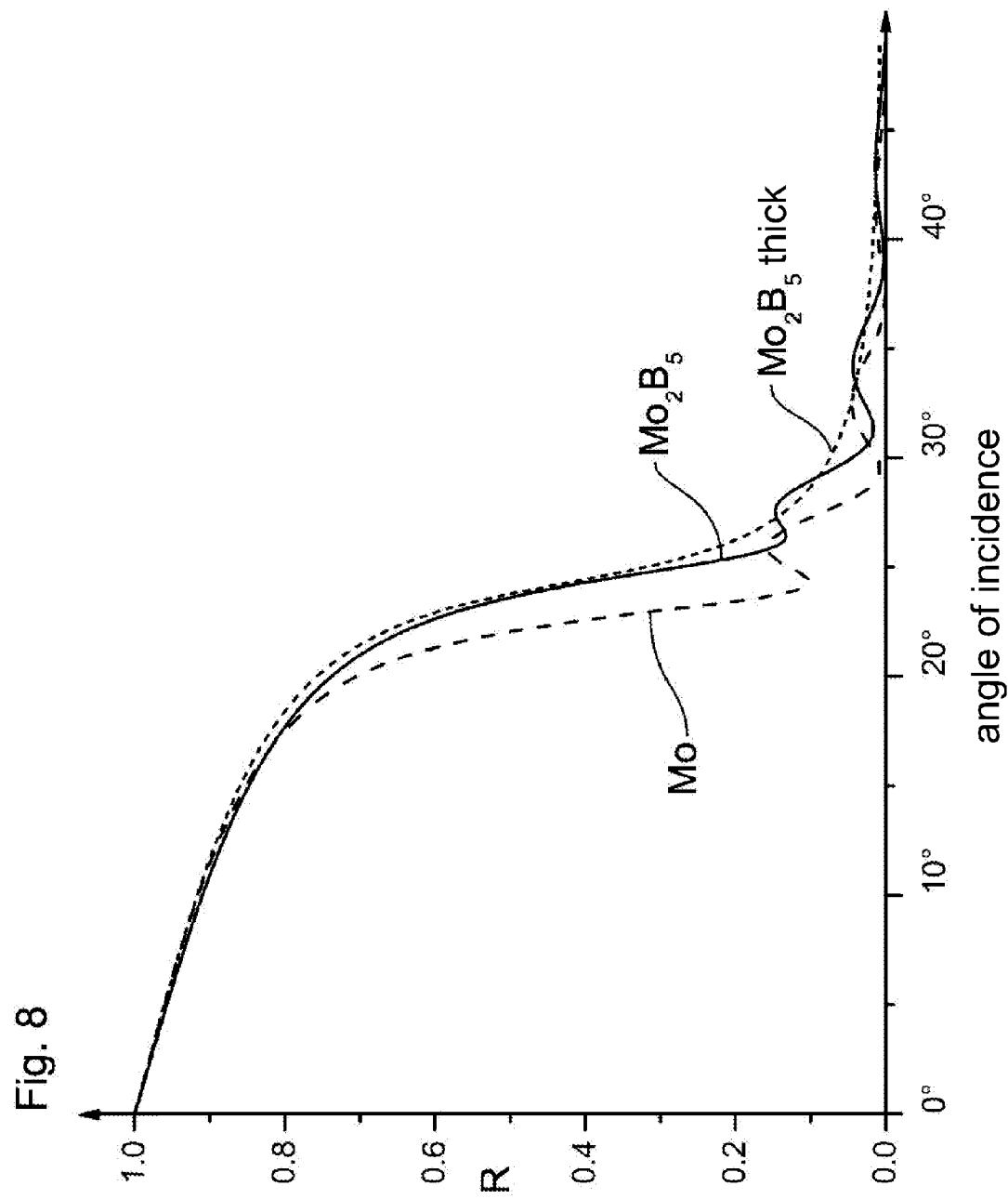
FIG. 8 shows, as a function of angle of incidence, the reflectivity of a reflecting coating made of molybdenum boride with a thickness of 100 nm and a thickness of 1000 nm compared to a reflecting coating made of molybdenum.

FIGS. 7 to 9 depict the reflectivities as a function of the angle of incidence (measured from the plane of the mirror surface or perpendicular to the surface normal) for some exemplary materials for the reflecting coating of mirrors for grazing incidence at a wavelength of 13.5 nm. The coatings as discussed in the following examples consist of one layer each. The calculations are based upon the values for optical constants from B. L. Henke, E. M. Gullikson and J. C. Davis: X-ray interactions: photoabsorption, scattering, transmission, and reflection at E=50–30000 eV, Z=1–92, Atomic Data and Nuclear Data Tables volume 54 (number 2), 181-342 (July 1993).

FIG. 7 depicts the reflectivity for a reflecting coating made of niobium boride on any substrate, specifically the reflectivity of a reflecting coating made of an $NbB_2$ layer (full line) which is approximately 100 nm thick. Compared thereto, the reflectivity of a mirror for grazing incidence with a niobium layer, which is approximately 100 nm thick, as a reflecting coating is also depicted (line made of long dashes). While the conventional mirror with a niobium layer only achieves a reflectivity of 60% or more up to angles of incidence of up to approximately 20°, such reflectivities are achieved up to approximately 21.5° using a niobium boride layer, as a result of which the overall reflectivity integrated over all angles can be noticeably increased.

FIG. 8 depicts the reflectivity for a reflecting coating made of molybdenum boride on any substrate, specifically the reflectivity of a reflecting coating made of an $Mo_2B_5$ layer (full line) which is approximately 100 nm thick and of an $Mo_2B_5$ layer (line made of short dashes) which is approximately 1000 nm thick. Compared thereto, the reflectivity of a mirror for grazing incidence with a molybdenum layer, which is approximately 100 nm thick, as a reflecting coating is also depicted (line made of long dashes). While the conventional mirror with a molybdenum layer only achieves a reflectivity of 60% or more up to angles of incidence of up to approximately 21°, such reflectivities are achieved up to approximately 22.5° using a molybdenum boride layer, as a result of which the overall reflectivity integrated over all angles of incidence can be noticeably increased. If the thick molybdenum boride layer is considered, it is possible to determine that it appears to exhibit solid-state properties and, as a result thereof, no reflectivity variations which can be traced back to interference appearances can be observed in the case of relatively high angles of incidence, which additionally leads to a slight increase in the overall reflectivity.

FIG. 9 depicts the reflectivity for reflecting coatings made of two different ruthenium borides, namely $RuB_2$ and $RuB_{12}$, on any substrate respectively, specifically the reflectivity of reflecting coatings made of a ruthenium boride layer (full lines) which is approximately 100 nm thick and of a ruthenium boride layer (lines made of short dashes) which is approximately 1000 nm thick. Compared thereto, the reflectivity of a mirror for grazing incidence with a ruthenium layer, which is approximately 100 nm thick, as a reflecting coating is also depicted (line made of long dashes). While the conventional mirror with a ruthenium layer only achieves a reflectivity of 60% or more up to angles of incidence of up to approximately 23.5°, such reflectivities are achieved up to approximately 24.5° using a thin $RuB_2$ layer and even up to approximately 26.5° by a thin $RuB_{12}$ layer, as a result of which the overall reflectivity integrated over all angles can be noticeably increased. By virtue of applying the respective ruthenium boride layer as a layer which is approximately 1000 nm thick, it is possible to obtain a reflectivity of 60% or more even up to angles of incidence of up to approximately 25.5° for a $RuB_2$ layer or up to approximately 27.5° for a $RuB_{12}$ layer.

By shifting higher reflectivities to higher angles of incidence by even up to 2° to 3° by the use of boron in the reflecting coatings of mirrors for the grazing incidence in the EUV wavelength range compared to conventional mirrors with reflecting coatings made of metal, it is possible to achieve a change in the reflectivity of several percent at the respective angle of incidence at certain angles of incidence. If it is moreover taken into account that the radiation is reflected a number of times, for example in embodiments as a collector mirror, it is possible to achieve an increase in the overall reflectivity of approximately 5%. It is additionally advantageous that metal borides or mixed metal borides, in particular, are distinguished by very high hardness and thermal resistance, making it possible to dispense with the application of protective layers, which protective layers can in general lead to a slight reduction in the reflectivity, on the reflecting coating. Moreover, as a result of this, these reflective optical elements are particularly well-suited for use as collector mirrors in the direct vicinity of plasma radiation sources.

REFERENCE SIGNS

1 EUV lithography device
10 Beam shaping system
11 Monochromator
12 EUV radiation source
13 Collector mirror
14 Illumination system
15 First mirror
16 Second mirror
17 Mask
18 Third mirror
19 Fourth mirror
20 Projection system
21 Wafer
100 Mirror
110 Substrate
120 Reflecting coating
130 Adhesion promoter
C Concentration
d, D Thickness
R Reflectivity

What is claimed is:

1. An optical element, comprising:
a substrate; and
a reflecting coating supported by the substrate,
wherein:
the reflecting coating comprises a layer that comprises a metal boride;
the metal boride comprises at least one metal selected from the group consisting of molybdenum, ruthenium, niobium, zirconium, rhodium, rhenium, palladium, gold, platinum, nickel, osmium, iridium, titanium, magnesium, calcium and strontium;
the layer has a thickness of more than 50 nm; and
the reflecting coating has a reflectivity of at least 60% for EUV radiation.

2. The optical element of claim 1, wherein the optical element is a grazing incidence optical element.

3. The optical element of claim 1, wherein the metal boride comprises a mixed metal boride.

4. The optical element of claim 3, wherein the mixed metal boride is a binary metal boride or ternary metal boride.

5. The optical element of claim 1, wherein the metal boride has a stoichiometry which varies over the thickness of the reflecting coating.

6. The optical element of claim 1, wherein the substrate comprises a material which comprises a material selected from the group consisting of a metal, a metal alloy, a glass, a glass ceramic, a ceramic, a monocrystalline semiconductor, a polycrystalline semiconductor, and a composite material.

7. The optical element of claim 1, further comprising an adhesion promoter layer between the substrate and the reflecting coating.

8. The optical element of claim 1, further comprising an adhesion promoter layer between the substrate and the reflecting coating, wherein the adhesion promoter layer comprises a metal of the metal boride.

9. The optical element of claim 1, further comprising an adhesion promoter layer between the substrate and the reflecting coating, wherein the metal boride comprises a mixed metal boride, and the adhesion promoter layer comprises a metal of the mixed metal boride.

10. The optical element of claim 1, wherein the thickness of the layer is more than 100 nm.

11. The optical element of claim 1, wherein the thickness of the layer is more than 1000 nm.

12. The optical element of claim 1, wherein the reflecting coating comprises only one layer that contains the metal boride.

13. The optical element of claim 1, wherein the reflecting coating consists of the layer.

14. The optical element of claim 1, wherein the optical element is a collector mirror.

15. The optical element of claim 1, wherein the reflectivity of the reflecting coating is at least 60% for EUV radiation when an angle of incidence of the EUV radiation with the reflecting layer is up to 24.5°.

16. The optical element of claim 15, wherein the reflectivity of the reflecting coating is at least 60% for EUV radiation when the angle of incidence of the EUV radiation with the reflecting layer is at least 15°.

17. An optical system, comprising:
an optical element, comprising:
a substrate; and
a reflecting coating supported by the substrate,
wherein:
the reflecting coating comprises a layer that comprises a metal boride;
the metal boride comprises at least one metal selected from the group consisting of molybdenum, ruthenium, niobium, zirconium, rhodium, rhenium, palladium, gold, platinum, nickel, osmium, iridium, titanium, magnesium, calcium and strontium;
the layer has a thickness of more than 50 nm;
the reflecting coating has a reflectivity of at least 60% for EUV radiation; and
the optical system is an EUV lithography optical system.

18. The optical system of claim 17, wherein the optical element is a grazing incidence optical element.

19. The optical system of claim 17, wherein the system is an EUV lithography illumination system.

20. The optical system of claim 17, wherein the reflecting coating comprises only one layer that contains the metal boride.

21. The optical element of claim 17, wherein the reflectivity of the reflecting coating is at least 60% for EUV radiation when an angle of incidence of the EUV radiation with the reflecting layer is up to 24.5°.

22. The optical element of claim 21, wherein the reflectivity of the reflecting coating is at least 60% for EUV radiation when the angle of incidence of the EUV radiation with the reflecting layer is at least 15°.

23. A device, comprising:
an illumination system; and
a projection objective,
wherein:
the device comprises an optical element;
the optical element comprises a substrate and a reflecting coating supported by the substrate;
the reflecting coating comprises a layer that comprises a metal boride;
the metal boride comprises at least one metal selected from the group consisting of molybdenum, ruthenium, niobium, zirconium, rhodium, rhenium, palladium, gold, platinum, nickel, osmium, iridium, titanium, magnesium, calcium and strontium;

the layer has a thickness of more than 50 nm;
the reflecting coating has a reflectivity of at least 60% for EUV radiation; and
the device is an EUV lithography device.

24. The device of claim 23, wherein the illumination system comprises the optical element.

25. The device of claim 23, wherein the reflecting coating comprises only one layer that contains the metal boride.

26. The device of claim 23, wherein the reflectivity of the reflecting coating is at least 60% for EUV radiation when an angle of incidence of the EUV radiation with the reflecting layer is up to 24.5°.

27. The device of claim 26, wherein the reflectivity of the reflecting coating is at least 60% for EUV radiation when the angle of incidence of the EUV radiation with the reflecting layer is at least 15°.

28. An optical element, comprising:
a substrate; and
a reflecting coating supported by the substrate,
wherein:
only one layer of the reflecting coating comprises a mixed metal boride:
the mixed metal boride comprises at least one metal selected from the group consisting of molybdenum, ruthenium, niobium, zirconium, rhodium, rhenium, palladium, gold, platinum, nickel, osmium, iridium, titanium, magnesium, calcium and strontium;
the only one layer of the reflecting coating that comprises the mixed metal boride has a thickness of more than 50 nm;
and
the reflecting coating has a reflectivity of at least 60% for EUV radiation.

29. The device of claim 28, wherein the reflectivity of the reflecting coating is at least 60% for EUV radiation when an angle of incidence of the EUV radiation with the reflecting layer is up to 24.5°.

30. The device of claim 29, wherein the reflectivity of the reflecting coating is at least 60% for EUV radiation when the angle of incidence of the EUV radiation with the reflecting layer is at least 15°.

* * * * *

UNITED STATES PATENT AND TRADEMARK OFFICE
CERTIFICATE OF CORRECTION

PATENT NO. : 9,703,209 B2
APPLICATION NO. : 14/321149
DATED : July 11, 2017
INVENTOR(S) : Vitaliy Shklover It is certified that error appears in the above-identified patent and that said Letters Patent is hereby corrected as shown below:

In the Specification

Column 2, Line 14, delete "$M1_{x1}M2_2M3_{x3}B_y.$" and insert -- $M1_{x1}M2_{x2}M3_{x3}B_y.$ --.

Signed and Sealed this
Twenty-fourth Day of October, 2017

Joseph Matal
*Performing the Functions and Duties of the
Under Secretary of Commerce for Intellectual Property and
Director of the United States Patent and Trademark Office*